United States Patent
Ohta et al.

(10) Patent No.: US 9,649,593 B2
(45) Date of Patent: May 16, 2017

(54) EPITAXIAL THIN FILM SOLID CRYSTAL ELECTROLYTE INCLUDING LITHIUM

(71) Applicant: Sony Corporation, Tokyo (JP)

(72) Inventors: Hiromichi Ohta, Aichi (JP); Noriyuki Aoki, Aichi (JP)

(73) Assignee: Sony Corporation, Tokyo (JP)

( * ) Notice: Subject to any disclaimer, the term of this patent is extended or adjusted under 35 U.S.C. 154(b) by 28 days.

(21) Appl. No.: 14/365,755

(22) PCT Filed: Nov. 5, 2012

(86) PCT No.: PCT/JP2012/078613
§ 371 (c)(1),
(2) Date: Jun. 16, 2014

(87) PCT Pub. No.: WO2013/099442
PCT Pub. Date: Jul. 4, 2013

(65) Prior Publication Data
US 2014/0308590 A1 Oct. 16, 2014

(30) Foreign Application Priority Data
Dec. 26, 2011 (JP) ................................. 2011-282589

(51) Int. Cl.
| | | |
|---|---|---|
| H01M 8/1246 | (2016.01) |
| B01D 53/32 | (2006.01) |
| C01B 33/12 | (2006.01) |
| C30B 29/32 | (2006.01) |
| H01G 11/56 | (2013.01) |
| H01M 10/0525 | (2010.01) |
| H01M 10/0562 | (2010.01) |
| H01M 10/0585 | (2010.01) |
| C30B 1/00 | (2006.01) |
| H01B 1/12 | (2006.01) |
| B01D 61/44 | (2006.01) |

(Continued)

(52) U.S. Cl.
CPC .......... *B01D 53/326* (2013.01); *B01D 61/44* (2013.01); *C01B 33/12* (2013.01); *C25B 13/04* (2013.01); *C30B 1/00* (2013.01); *C30B 23/066* (2013.01); *C30B 25/02* (2013.01); *C30B 29/32* (2013.01); *H01B 1/122* (2013.01); *H01G 9/15* (2013.01); *H01G 11/56* (2013.01); *H01M 8/1246* (2013.01); *H01M 10/052* (2013.01); *H01M 10/0525* (2013.01); *H01M 10/0562* (2013.01); *H01M 10/0585* (2013.01); *C30B 29/22* (2013.01); *C30B 29/30* (2013.01); *H01G 11/06* (2013.01); *H01M 8/1016* (2013.01); *H01M 2300/0068* (2013.01); *H01M 2300/0071* (2013.01); *Y02E 60/13* (2013.01); *Y02E 60/525* (2013.01); *Y02P 70/54* (2015.11); *Y02P 70/56* (2015.11); *Y02T 10/7011* (2013.01); *Y02T 10/7022* (2013.01)

(58) Field of Classification Search
None
See application file for complete search history.

(56) References Cited

FOREIGN PATENT DOCUMENTS

| | | | |
|---|---|---|---|
| JP | 2004091253 A | * | 3/2004 |
| JP | 2009-181807 | | 8/2009 |
| JP | 2010-140703 | | 6/2010 |

OTHER PUBLICATIONS

EN translation of JP2009181807-2009.*

(Continued)

*Primary Examiner* — Lucas J. O'Donnell
(74) *Attorney, Agent, or Firm* — K&L Gates LLP (57) ABSTRACT

Provided is a solid electrolyte including an epitaxial thin film crystal made of an electrolyte containing at least lithium.

5 Claims, 6 Drawing Sheets (51) Int. Cl.
*C25B 13/04* (2006.01)
*C30B 23/06* (2006.01)
*C30B 25/02* (2006.01)
*H01G 9/15* (2006.01)
*H01M 10/052* (2010.01)
*C30B 29/22* (2006.01)
*C30B 29/30* (2006.01)
*H01G 11/06* (2013.01)
*H01M 8/1016* (2016.01)

(56) References Cited

OTHER PUBLICATIONS

Epitaxial Li0.5La0.5TiO3 Solid Electrolyte Thin Film for Lithium Ion Battery, 214th ECS Meeting Abstract No. 683 2008, CHO.*
Stramare, Lithium Lanthanum Titanates: A Review, Chem. Mater. 2003, 15, 3974.*
J. Am. Chem. Soc., 2004, 126 (11), pp. 3587-3596, hereafter Garcia-Martin.*
Yanbin Chen, Microstructure of Perovskite Oxide Thin Films Grown on Miscut/Small Lattice-Mismatched Substrates, Doctoral Thesis, University of Michigan Department of Materials Science (2008).*
Hiromichi et al., Lithium-ion conducting La2/3-xLi3xTiO3 solid electrolyte thin films with stepped and terraced surfaces, Applied Physics Letters, 100, 173107 (2012).*
Hirayama et al., "Epitaxial growth and electrochemical properties of Li4Ti5O12 thin-film lithium battery anodes", Dalton Trans., 2011, 40, 2882 (2011).*

* cited by examiner

EPITAXIAL THIN FILM SOLID CRYSTAL ELECTROLYTE INCLUDING LITHIUM

CROSS REFERENCES TO RELATED APPLICATIONS

The present application is a national stage of International Application No. PCT/JP2012/078613 filed on Nov. 5, 2012 and claims priority to Japanese Patent Application No. 2011-282589 filed on Dec. 26, 2011, the disclosure of which is incorporated herein by reference.

BACKGROUND

The present disclosure relates to a solid electrolyte, a method of preparing the solid electrolyte, and an electrochemical device. More specifically, the present disclosure relates to, for example, a solid electrolyte suitable for use as an electrolyte in an all solid-state lithium (Li) ion battery, and a method of preparing the same, and various electrochemical devices such as a lithium ion battery using the solid electrolyte.

In recent years, an all solid-state lithium ion battery using a solid electrolyte which is a lithium ion conductor attracts attention, which acts as a secondary battery having a higher safety compared to an existing lithium ion battery using, as an electrolyte, a non-aqueous electrolyte which dissolves a lithium salt into an organic solvent (refer to, for example, Patent Literature 1). That is, the lithium ion conductor constituting the solid electrolyte is a single ion conductor in which only a lithium ion moves so that a side reaction and deterioration of an electrode accompanied thereby hardly take place compared to a secondary battery using a liquid electrolyte. Accordingly, the all solid-state lithium ion battery is a promising entry for a battery for an electric vehicle and a large-sized rechargeable battery.

In particular, the all solid-state lithium ion battery is expected to be preferably used as an in-vehicle higher output electric source because it is highly functional, highly reliable, highly risk-free without liquid spill, can obtain clean energy, is light-weighted, and can obtain higher energy density.

The most important material in this all solid-state lithium ion battery is the solid electrolyte exhibiting the lithium ion conductivity comparable to that of an organic solvent. While a number of solid electrolyte materials have been proposed, the most promising entry with respect to the safety is $La_{2/3-x}Li_{3x}Ti_3$ (popular name: LLT) reported by Inaguma, et. al. of its higher lithium ion conductivity (refer to Non-Patent Literature 1).

CITATION LIST

Patent Literature

Patent Literature 1: JP 2010-140703A
Non-Patent Literature 1: Y. Inaguma et al., Solid State Commun. 86, 689 (1993)
Non-Patent Literature 2: S. Furusawa et al., Solid State Ionics 176, 553 (2005)
Non-Patent Literature 3: Y. Inaguma et al., J. Ceram. Soc. Jpn. 105, 548 (1997)
Non-Patent Literature 4: M. Kawasaki et al., Science 266, 1540 (1994)

SUMMARY

Technical Problem

The functions required for the solid electrolyte of the all solid-state lithium ion battery include (1) the lithium ion conductivity comparable to that of an organic solvent, and (2) the endurance against high-load charge and discharge (100° C. in case of a vehicle). The above functions (1) and (2) of the LLT are inferior to those of an organic solvent in one digit or more. Although the lithium ion conductivity of the LLT inside of a bulk is high comparable to that of a liquid electrolyte, it decreases extremely on a particle interface. Since the LLT is generally used as a particle, it cannot be applied as the solid electrolyte unless the lithium ion conductivity on the particle interface is increased.

In order to increase the lithium ion conductivity of the LLT to the level comparable to that of the organic solvent, the LLT particle interface which is a bottleneck may be removed. In 2005, Furusawa et al. reported that the lithium ion conductivity could be significantly increased by the amorphization of the LLT (refer to Non-Patent Literature 2). An amorphous thin film is obtained by forming an LLT thin film at an ambient temperature through a pulsed laser deposition method. Because of the absence of the LLT crystal particles in the amorphous thin film, the entire LLT thin film exhibits the high lithium ion conductivity as is the case for the inside of a bulk.

However, in general, the amorphous thin film is unstable because its ingredient (especially, Li) easily evaporates in a high-temperature circumstance resulting in the crystallization. Especially, in case of the crystallization, the LLT particle interface is produced and a probability exists that the lithium ion conductivity rapidly decreases so that a problem arises that it is not suitable as the solid electrolyte.

An LLT bulk single crystal manufactured by a floating zone method by Inaguma et al. is exemplified as the LLT crystal which is not amorphous and includes no particle interface (refer to Non-Patent Literature 3). However, its size is small such as 3×2×1 mm$^3$ and its surface area is small so that it could not be used as a battery material.

Accordingly, a problem to be solved by the present disclosure is to provide a solid electrolyte which can produce lithium ion conductivity comparable to an organic solvent and easily increase its surface area, and a method of preparing the same.

Another problem to be solved by the present disclosure is to provide an electrochemical device using the above excellent solid electrolyte.

The above problems and other problems will be apparent by the following description in this Description referring to the annexed drawings.

Solution to Problem

In order to overcome the above problems, according to an embodiment of the present disclosure, there is provided a solid electrolyte including an epitaxial thin film made of an electrolyte containing at least lithium.

Further, according to the present disclosure, there is provided a method of preparing a solid electrolyte including a step of forming an epitaxial thin film crystal by epitaxially growing an electrolyte containing at least lithium on a single crystal substrate.

Further, according to the present disclosure, there is provided an electrochemical device containing a solid electrolyte including an epitaxial thin film crystal made of an electrolyte which is epitaxially grown and contains at least lithium.

The electrolyte containing lithium (Li) of the present disclosure may be basically any one, and is selected depending on necessity. The electrolyte is suitably at least one selected from the group consisting of an oxide, a phosphoric acid-based compound, a germanic acid-based compound, a sulfide and a nitride. For example, this electrolyte is specifically at least one electrolyte selected from the group consisting of $La_{2/3-x}Li_{3x}TiO_3$ ($0<x<\frac{2}{3}$), $La_{0.5}Li_{0.5}TiO_3$, $Li_{4+x}M_xSi_{1-x}O_4$ (M=B, Al), $Li_7La_3Zr_2O_{12}$, $Li_9SiAlO_8$, $Li_5La_3Ta_2O_{12}$, $Li_5La_3Nb_2O_{12}$, $Li_6BaLa_2Ta_2O_{12}$, $Li_{3.6}Si_{0.6}P_{0.4}O_4$, $LiZr_2(PO_4)_3$, $Li_{1+x}M_xTi_{2-x}(PO_4)_3$, $Li_{14}Zn(GeO_4)_4$, $Li_{3.25}Ge_{0.25}P_{0.75}S_4$, $Li_{10}GeP_2S_{12}$ and $Li_3N$, but is not restricted thereto.

The epitaxial thin film crystal is typically obtained by epitaxially growing (hetero-epitaxially growing) the electrolyte containing at least Li on a single crystal substrate. This epitaxial thin film crystal is suitably configured by terraces which are flat at an atomic level and steps, and includes a flat surface of which a mean-square surface roughness measured on a region of 2 μm square is 1 nm or less. The flat surface is configured by, most suitably, only terraces which are flat at an atomic level and steps. In order to obtain the epitaxial thin film crystal having the flat surface, the electrolyte containing at least Li may be epitaxially grown on the single crystal substrate having a similar flat surface. This single crystal substrate is appropriately selected depending on the kind of the electrolyte which is epitaxially grown. As the single crystal substrate, at least one substrate selected from the group consisting of an oxide having a perovskite-type crystal structure represented by a general formula $ABO_3$ (A is at least one element selected from the group consisting of Sr, Ba, La and K, and B is at least one element selected from the group consisting of Ti, Al and Ta), $NdGaO_3$, YSZ (yttria-stabilized zirconia), MgO, $Al_2O_3$ and Si is used. Among these, the oxide having the perovskite-type crystal structure represented by $ABO_3$ is at least one oxide selected from the group consisting of $SrTiO_3$, $LaAlO_3$ and $(LaSr)(AlTa)O_3$.

The epitaxial thin film crystal may be formed wholly by a single crystal region having the same crystal orientation, or may include a domain structure formed by at least two single crystal regions of which crystal orientations are different from each other. In case of the domain structure formed by the at least two single crystal regions, at least one single crystal region is suitably present along an entire thickness direction of the epitaxial thin film crystal.

In order to fabricate the epitaxial thin film crystal, the electrolyte containing Li is epitaxially grown on the single crystal substrate through a pulsed laser deposition (PLD) method, a sputtering method, an electron beam deposition method, a metalorganic chemical vapor deposition (MOCVD) method, a molecular beam epitaxy (MBE) method or an atomic layer epitaxial growth (ALE) method. When the electrolyte is epitaxially grown, the epitaxial thin film crystal having a flat surface cannot be obtained at a temperature too low while Li gets out of the epitaxial thin film crystal at a temperature too high. Accordingly, the electrolyte is epitaxially grown on the single crystal substrate at the substrate temperature of, suitably, 200° C. or more and 1200° C. or less, and, more suitably, of 600° C. or more and 900° C. or less. During the epitaxial growth of the electrolyte, when an oxygen partial pressure (oxygen pressure) of an atmosphere is too low, the electron conductivity appears due to the reduction of the constituent element of the electrolyte, for example, Ti, and on the other hand, the epitaxial thin film crystal is difficult to be formed when the oxygen partial pressure is too high. Accordingly, the electrolyte is epitaxially grown on the single crystal substrate under an atmosphere of which an oxygen partial pressure is suitably $1\times10^{-5}$ Pa or more and $1\times10^3$ Pa or less, and more suitably $1\times10^{-1}$ Pa or more and $1\times10^2$ Pa or less.

When the epitaxial thin film crystal including the above-mentioned domain structure is produced, for example, after the epitaxial thin film crystal is formed by epitaxially growing the electrolyte on the single crystal substrate, a domain structure is suitably formed by at least two single crystal regions of which crystal orientations are different from each other by heating the epitaxial thin film crystal. Suitably, for example, after the epitaxial thin film crystal is formed by epitaxially growing the electrolyte on the single crystal substrate, the epitaxial thin film crystal is heated at a temperature of 1000° C. or more and 1500° C. or less for one minute or more and two hours or less, and more suitably is heated at a temperature of 1200° C. or more and 1400° C. or less for five minutes or more and 30 minutes or less. The atmosphere during the heating is selected depending on necessity, and is atmospheric air, for example. After the heating, the spontaneous cooling is conducted, for example, in a furnace.

The electrochemical device may be basically any one, and specifically includes various batteries using Li, a capacitor, a sensor and an Li ion filter, for example. The batteries using Li include a secondary battery, an air cell and a fuel cell. The secondary battery is, for example, a lithium ion battery, and an all solid-state lithium ion battery can be realized by using a solid electrolyte. In this electrochemical device, depending on necessity, the epitaxial thin film crystal is used directly on a conductive single crystal substrate or indirectly via another conductive layer. In this case, the conductive single crystal substrate can be used as an electrode or a current collector electrically connected to the epitaxial thin film crystal.

Further, according to the present disclosure, there is provided a battery package including:

a secondary battery;

a control means for performing control regarding the above secondary battery; and an exterior package containing the above secondary battery.

The secondary battery includes a solid electrolyte configured by an epitaxial thin film crystal epitaxially grown and made of an electrolyte containing at least lithium.

In this battery package, the control means performs control of charge and discharge, overdischarge and overcharge with respect to the secondary battery.

According to the present disclosure, there is provided an electronic device receiving power supply from a secondary battery containing a solid electrolyte configured by an epitaxial thin film crystal epitaxially grown and made of an electrolyte containing at least lithium.

According to the present disclosure, there is provided an electric vehicle including:

a conversion device converting power supply from a secondary battery into a driving force of a vehicle; and a control device performing information processing with respect to vehicle control based on information with respect to the above secondary battery.

The secondary battery includes a solid electrolyte configured by an epitaxial thin film crystal epitaxially grown and made of an electrolyte containing at least lithium.

In this electric vehicle, the conversion device typically generates a driving force after receiving, from the secondary battery, power supply for rotating a motor. This motor can utilize also regenerative energy. The control device performs information processing with respect to vehicle control based on the remaining battery level of the secondary battery. This electric vehicle includes an electric car, an electric motorcycle, an electric bicycle and a railroad vehicle, and further includes a hybrid vehicle.

According to the present disclosure, there is provided an electric power system configured by receiving power supply from a secondary battery and/or by supplying power from a power source to the secondary battery.

The secondary battery includes a solid electrolyte configured by an epitaxial thin film crystal epitaxially grown and made of an electrolyte containing at least lithium.

The electric power system may be any one so long as electric power is used, and includes a simple electric power apparatus. This electric power system includes, for example, a smart grid, a home energy management system (HEMS) and a vehicle, and enables electric storage.

Further, according to the present disclosure, there is provided a power source for power storage configured by connecting an electronic device to which power is supplied and includes a secondary battery.

The secondary battery includes a solid electrolyte configured by an epitaxial thin film crystal epitaxially grown and made of an electrolyte containing at least lithium.

The usage of this power source for power storage is not considered, and can be basically used in any power supply system or power supply apparatus, for example, in a smart grid.

Since no crystal grain boundary exists on the epitaxial thin film crystal made of the electrolyte containing the lithium in the above-mentioned present disclosure, the lithium ion conductivity in the epitaxial thin film crystal can be increased to a level comparable to an organic electrolyte. Since the epitaxial thin film crystal can be prepared by epitaxially growing the electrolyte containing the lithium on the single crystal substrate in accordance with the various growth methods, the crystal of the large surface area can be easily obtained.

Advantageous Effects of Invention

In accordance with the present disclosure, the lithium ion conductivity comparable to an organic electrolyte can be obtained, and the solid electrolyte in which the larger surface area is easily performed can be obtained. The high performance electrochemical device such as the all solid-state lithium ion battery can be realized by using such the excellent solid electrolyte.

Additional features and advantages are described herein, and will be apparent from the following Detailed Description and the figures.

DETAILED DESCRIPTION

Embodiments for implementing inventions (hereinafter referred to as "embodiments") will be described. The description proceeds with the following order.
1. First embodiment (solid electrolyte and method of preparing same)
2. Second embodiment (solid electrolyte and method of preparing same)
3. Third embodiment (all solid-state lithium ion battery)

1. First Embodiment

"Solid Electrolyte"

Figure 1:
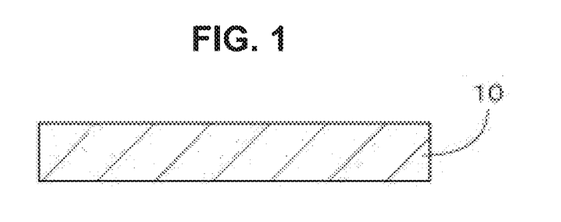
FIG. 1 is a sectional view showing an epitaxial thin film crystal constituting a solid electrolyte in accordance with a first Embodiment.

FIG. 1 shows an epitaxial thin film crystal 10 constituting a solid electrolyte in accordance with a first embodiment. The epitaxial thin film crystal 10 is made of an oxide containing lithium, a phosphoric acid-based compound, a germanic acid-based compound, a sulfide and a nitride and so on, and specifically made of the various electrolytes already described. The thickness of the epitaxial thin film crystal 10 is not especially restricted, and is generally 0.4 nm or more and 5 μm or less, for example.

In this case, the epitaxial thin film crystal 10 is formed wholly by a single crystal region having the same crystal orientation and includes no crystal grain boundary.

Figure 2:
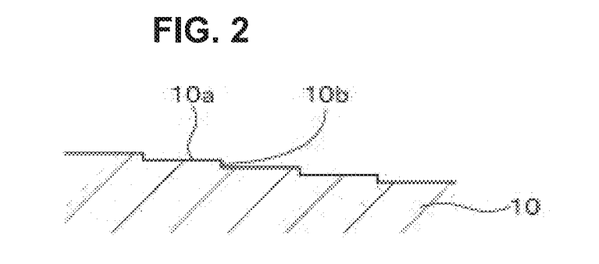
FIG. 2 is a sectional view schematically showing a surface shape of the epitaxial thin film crystal constituting the solid electrolyte in accordance with the first Embodiment.

As shown in FIG. 2, the epitaxial thin film crystal 10 is suitably configured by flat terraces 10a at an atomic level and steps 10b in a larger part of at least its main surface, and includes a flat surface of which a mean-square surface roughness measured on a region of 2 μm square is 1 nm or less. Most suitably, the flat surface is configured by only the terraces 10a and the steps 10b.

Figure 3:
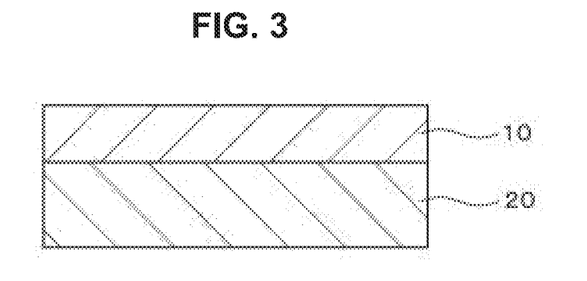
FIG. 3 is a sectional view showing a state the epitaxial thin film crystal constituting the solid electrolyte in accordance with the first Embodiment is grown on the single crystal substrate.

While, as shown in FIG. 3, the epitaxial thin film crystal 10 is typically used in a state where it is epitaxially grown on a single crystal substrate 20, it may be used as a single substance which is peeled off from the single crystal substrate 20 after the epitaxial growth. The single crystal substrate 20 can be selected among the various single crystal substrates already described depending on necessity.

Figure 4:
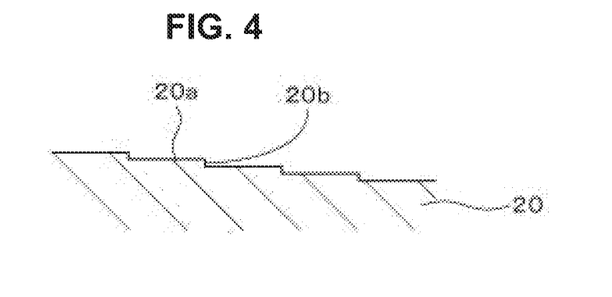
FIG. 4 is a sectional view schematically showing a surface shape of the single crystal substrate shown in FIG. 3.

As shown in FIG. 4, the single crystal substrate 20 is suitably configured by flat terraces 20a at an atomic level and steps 20b in a larger part of at least its main surface, and includes a flat surface of which a mean-square surface roughness measured on a region of 2 μm square is 1 nm or less. Most suitably, the flat surface is configured by only the above terraces 20a and the steps 20b. By using such the single crystal substrate 20 including the flat surface, the surface of the epitaxial thin film crystal 10 epitaxially grown on this single crystal substrate 20 can be made a flat surface as shown in FIG. 2.

"Method of Preparing Solid Electrolyte"

A method of preparing a solid electrolyte will be described.

At first, a single crystal substrate 20 is prepared. As shown in FIG. 4, a substrate having a flat surface configured by only terraces 20a and steps 20b is suitably used as the single crystal substrate 20.

Then, as shown in FIG. 3, an epitaxial thin film 10 is fabricated by growing an electrolyte containing Li on the single crystal substrate 20 through a PLD method, a sputtering method, an electron beam deposition method, an MOCVD method and an ALE method. In this manner, the solid electrolyte made of the epitaxial thin film crystal 10 is fabricated. While a substrate temperature during the epitaxial growth is appropriately selected depending on the kinds of the single crystal substrate 20 and the electrolyte, it is suitably 200° C. or more and 1200° C. or less, and more suitably 600° C. or more and 900° C. or less. An oxygen partial pressure during the epitaxial growth is $1 \times 10^{-5}$ Pa or more and $1 \times 10^3$ Pa or less, and more suitably $1 \times 10^{-1}$ Pa or more and $1 \times 10^2$ Pa or less. The growth rate is not especially restricted, and appropriately selected.

The epitaxial thin film crystal 10 having the flat surface as shown in FIG. 2 can be obtained by using the single crystal substrate 20 having the flat surface as shown in FIG. 4.

Example 1

Figure 5:
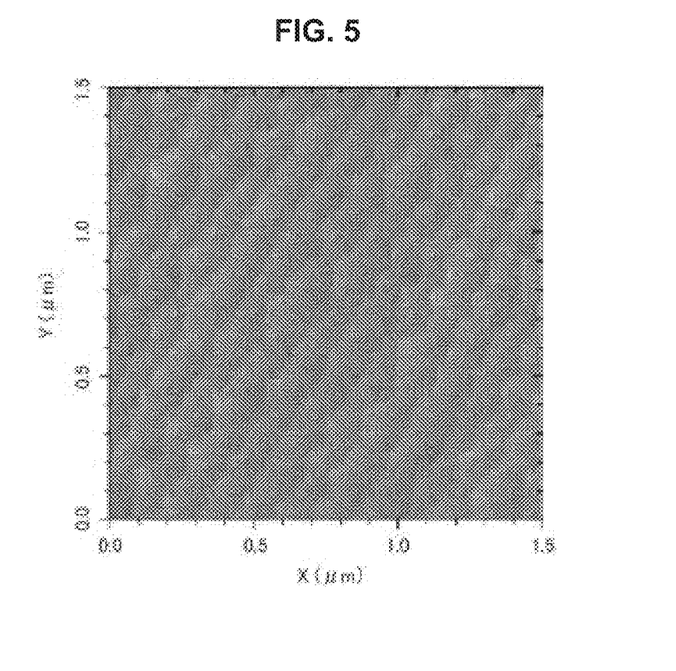
FIG. 5 is a drawing-substituting photograph showing an atomic force microscope photograph of a (001) $SrTiO_3$ single crystal substrate in which a surface is flattened at an atomic level in Example 1.

As the single crystal substrate 20, an $SrTiO_3$ single crystal substrate (plane direction (001), 10 mm×10 mm×thickness 0.5 mm, available from Shinkosha Co., Ltd,) of which a surface was flattened by a method described in Non-Patent Literature 4 was prepared. An atomic force microscope (AFM) photograph of the surface of this $SrTiO_3$ single crystal substrate is shown in FIG. 5. As shown in FIG. 5, the surface of the this $SrTiO_3$ single crystal substrate can be found to be configured by only terraces flat at an atomic level and steps.

Then, the vacuum chamber of a pulsed laser deposition apparatus (available from Pascal Corporation) was evacuated to $1 \times 10^{-5}$ or less. After the prepared $SrTiO_3$ single crystal substrate and a sintered target having composition of $La_{2/3-x}Li_{3x}TiO_3$ (18 mmφ×5 mm, available from Toshima Manufacturing Co., Ltd., x=0.05, 0.1, 0.167) were mounted in the vacuum chamber, pure oxygen gas was introduced such that the inner pressure of the chamber became to 5 Pa. Thereafter, the $SrTiO_3$ single crystal substrate was heated to 850° C., and the self-rotating target was ablated by radiating the collected excimer laser pulses (2 J per one pulse and 1 $cm^2$, laser oscillation frequency: 10 Hz) and was accumulated for 30 minutes on the $SrTiO_3$ single crystal substrate placed on an opposite position, After the thus prepared thin film was cooled until the substrate temperature reached 200° C. in the vacuum chamber, it was taken out to atmospheric air. The thickness of the thin film was 56 nm.

In order to investigate the chemical composition of the thus-prepared thin film, an ICP-MS analysis was conducted. As a result, the LiLa ratio of the thin film prepared by using the sintered target of the $La_{2/3-x}Li_{3x}TiO_3$ (x=0.167) composition was 1.1 which was in accord with the target composition ($La_{2/3-x}Li_{3x}TiO_3$) in an error range. Accordingly, the obtained thin film can be identified as an LLT thin film.

Figure 6:
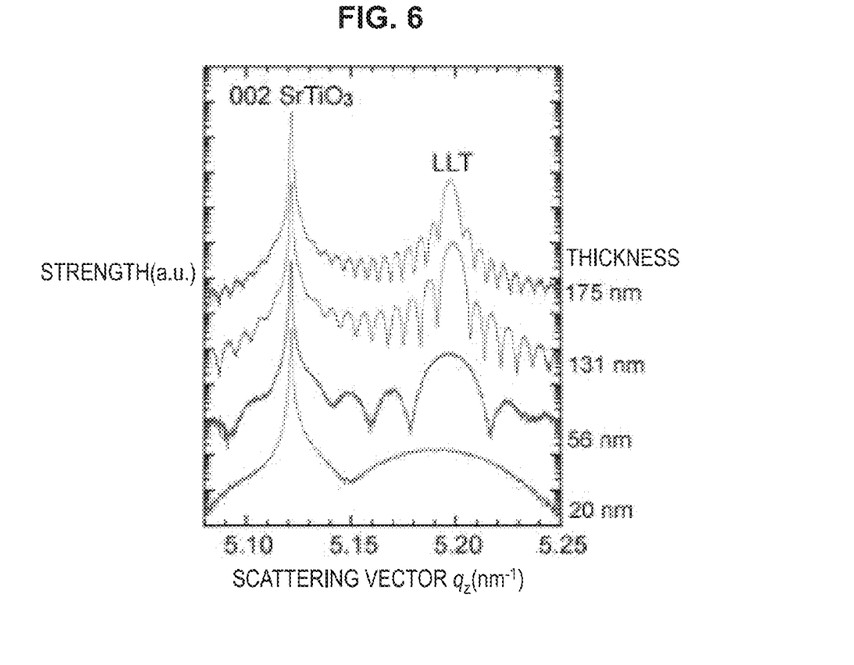
FIG. 6 is a schematic diagram showing an X-ray diffraction pattern of an LLT thin film prepared on a (001) $SrTiO_3$ single crystal substrate by a pulsed laser deposition method in Example 1.
Figure 7:
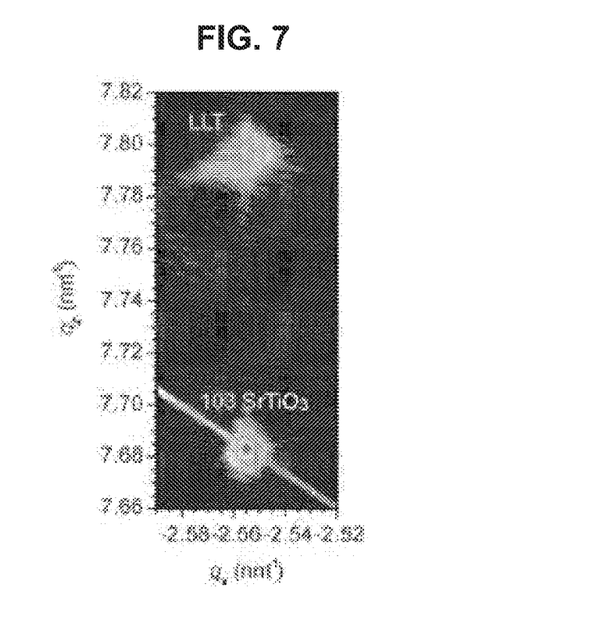
FIG. 7 is a schematic diagram showing an X-ray reciprocal lattice mapping of an LLT thin film prepared on a (001) $SrTiO_3$ single crystal substrate by a pulsed laser deposition method in Example 1.

The crystal evaluation of the obtained LLT thin film was conduced by using a high resolution thin film X-ray diffraction apparatus (XRD, ATX-G available from Rigaku Corporation). An out-of plane XRD pattern (an X-ray diffraction pattern obtained by diffraction on a lattice surface parallel to a sample) is shown in FIG. 6. As shown in FIG. 6, a sharp diffraction peak of the thin film together with a 002 diffraction peak of the $SrTiO_3$ was observed, and an interference pattern which suggests the significantly high degree of the orientation of the thin film was observed around them. When an out-of-plane locking curve was measured, its half-band width was 0.02° which was in accord with that of the $SrTiO_3$ single crystal substrate. A result of reciprocal lattice mapping measurement in the vicinity of the 103 diffraction peak of $SrTiO_3$ was shown in FIG. 7. As shown in FIG. 7, it was found that the crystal lattice of the thin film along an in-plane direction was in accord with $SrTiO_3$. As a result of the crystal evaluation by the above X-ray diffraction, it was found that the prepared thin film was the LLT epitaxial thin film crystal.

Figure 8:
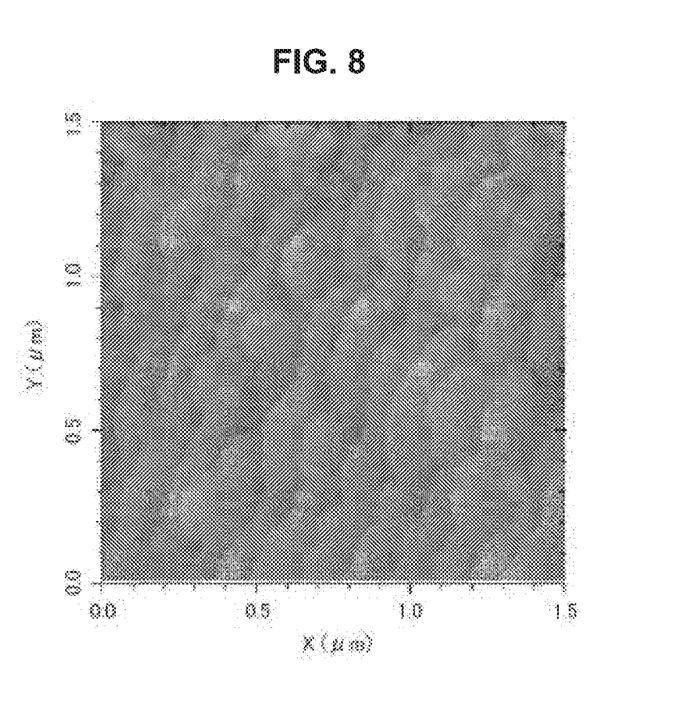
FIG. 8 is a drawing-substituting photograph showing an atomic force microscope photograph of an LLT thin film formed on a (001) $SrTiO_3$ single crystal substrate in Example 1.

A surface shape of the prepared LLT thin film was observed with AFM. An AFM image is shown in FIG. 8. As shown in FIG. 8, a surface is observed which is flat at an atomic level and configured by only terraces having a width of about 200 nm and a surface flat at an atomic level, and steps of a height of 0.4 nm corresponding to one unit lattice of LLT. A mean-square surface roughness (Rrms) was about 0.3 nm which was in accord with that of the $SrTiO_3$ having the flattened surface.

Figure 9:
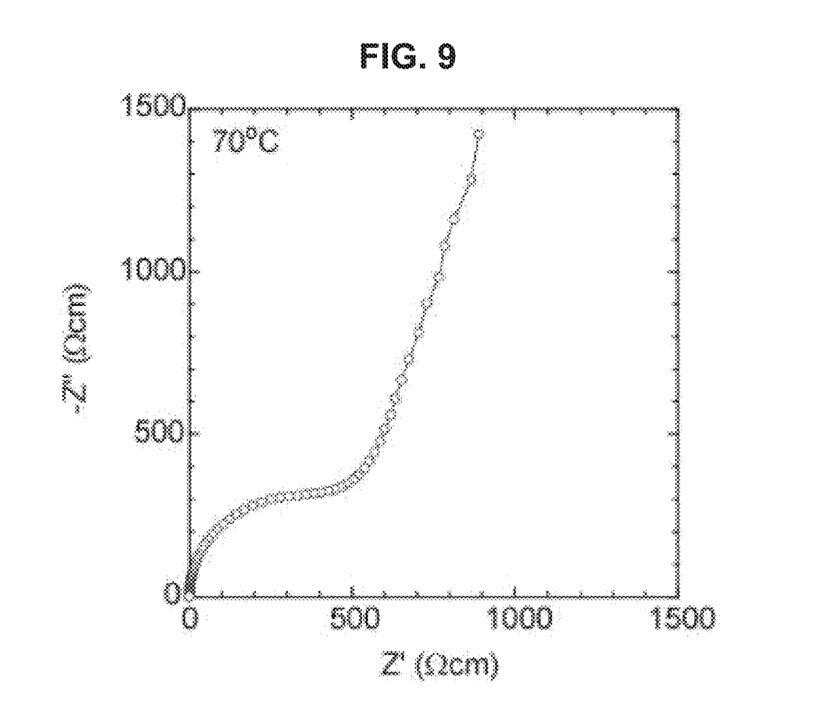
FIG. 9 is a schematic diagram showing a Cole-Cole plot of an LLT thin film formed on a (001) $SrTiO_3$ single crystal substrate at 70° C. in Example 1.

A lithium ion conductivity of the prepared LLT film (x=0.1) was measured as follows. That is, a comb-shaped electrode was fabricated by DC-sputtering gold (Au) on the surface of the prepared LLT thin film, and the lithium ion conductivity was measured with an impedance analyzer (YHP4192A, available from Yokogawa Hewlett-Packard Company, 5 Hz to 13 MHz). The Cole-Cole plot of the LLT thin film (x=0.1) measured at 70° C. was shown in FIG. 9. As shown in FIG. 9, similarly to the report of Inaguma et al, a half circle showing bulk conduction is shown in the higher frequency region, and spread of resistances originating from electrode-LLT thin film interface resistances is shown in a lower frequency region. The lithium ion conductivities of the bulk components at 50 to 70° C. are summarized in Table 1. The lithium ion conductivities comparable to the reported values of the bulk single crystals of Inaguma et al. (Non-Patent Literature 3) were obtained.

TABLE 1

| Temperature (° C.) | 50 | 60 | 70 |
|---|---|---|---|
| Conductivity (mS/cm) | 0.93 | 1.5 | 2.3 |
| Values in literature (mS/cm) | 1.3 | 1.8 | 2.8 |

It was found from the above that the prepared LLT thin film includes the same chemical compositions as that of the target material, exhibits the lithium ion conductivity comparable to that of the single crystal and is the epitaxial thin film having the surface which is flat at an atomic level.

In accordance with this first embodiment, the following advantages can be obtained. That is, the epitaxial thin film 10 constituting the solid electrolyte includes no crystal grain boundary and exhibits the lithium ion conductivity comparable to that of the bulk single crystal. That is, because of the absence of the crystal grain boundary in this epitaxial thin film, the conductivity comparable to the lithium ion conductivity of an organic electrolyte can be obtained. For example, the LLT single crystal thin film without the crystal grain boundary which is configured by the terraces being flat at the atomic level and the steps and includes the flat surface of which the mean-square surface roughness measured on the region of 2 μm square is 1 nm or less can be prepared by epitaxially growing the $La_{2/3-x}Li_{3x}TiO_3$ (0<x<2/3) LLT thin film on the $SrTiO_3$ single crystal substrate through the PLD method. The lithium ion conductivity of this LLT single crystal thin film is comparable to that of the LLT bulk single crystal, and no higher resistant component due to the crystal grain boundary is observed. Since the epitaxial thin film crystal 10 can be prepared by epitaxially growing the electrolyte on the single crystal substrate 20, its surface area is easily increased and the thin film can be used as battery materials.

This excellent epitaxial thin film crystal 10 exhibits charge and discharge characteristics nearly equal to those of an existing lithium ion battery by utilizing as the solid electrolyte of an all solid-state lithium ion battery, and realizes a battery with extremely high safety. Since the LLT single crystal thin film without the crystal grain boundary includes the surface which is flat at the atomic level, the control of a nano-structure such as an artificial superlattice is easy and the thin film can be a model of improving the lithium ion conductivity of the LLT particle interface.

2. Second Embodiment

"Solid Electrolyte"

Figure 10:
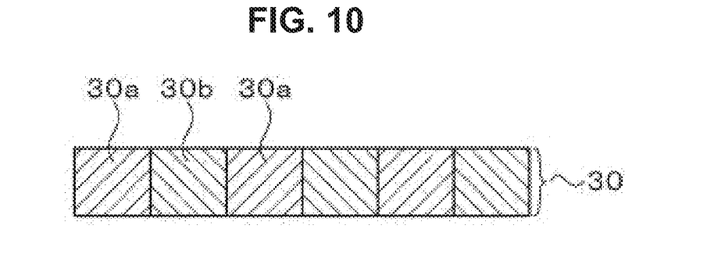
FIG. 10 is a sectional view showing an epitaxial thin film crystal constituting a solid electrolyte in accordance with a second embodiment.

FIG. 10 shows an epitaxial thin film crystal 30 constituting a sold electrolyte in accordance with a second embodiment. This epitaxial thin film crystal 30 is made of, similar to the epitaxial thin film crystal 10, an oxide containing Li, a phosphoric acid-based compound, a germanic acid-based compound, a sulfide and a nitride, but is different in including a domain structure. Specifically, this epitaxial thin film crystal 30 is arranged by single crystal regions 30a, 30b separated by coordination surfaces along the parallel to the surfaces. When, for example, the crystal structure of this epitaxial thin film crystal 30 is tetragonal and a c-axis and an a-axis are present on the surface of this epitaxial thin film crystal 30, the c-axis of the single crystal regions 30a and the c-axis of the single crystal regions 30b are misaligned by 90° C. from each other. The single crystal regions 30a, 30b are present suitably along the entire thickness direction of the epitaxial thin film crystal 30, and though FIG. 10 shows such the case, it is not necessarily restricted thereto.

The subjects other than the above are the same as those of the first embodiment.

"Method of Preparing Solid Electrolyte"

Figure 11:
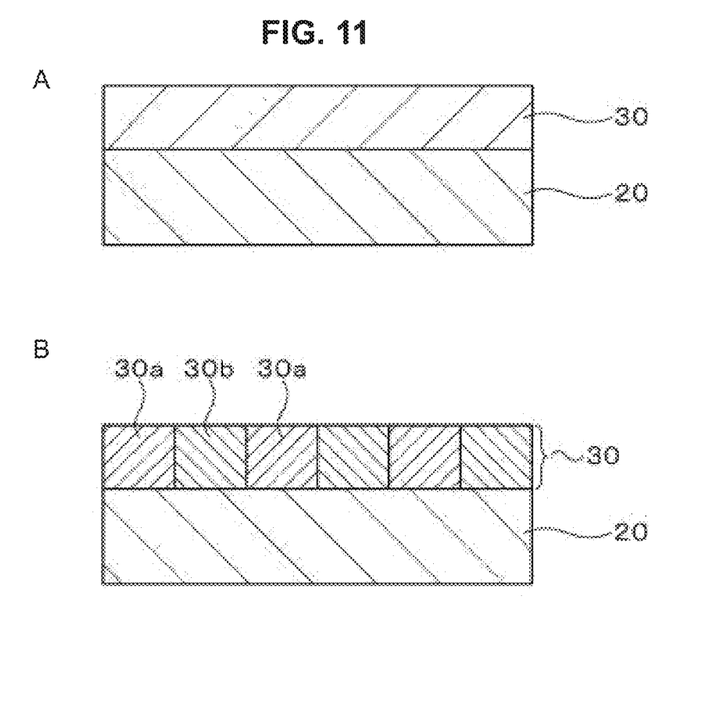
FIG. 11A and FIG. 11B are sectional views for describing a method of preparing the solid electrolyte in accordance with the second embodiment.

As shown in FIG. 11A, at first, an epitaxial thin film crystal 30 is prepared on a single crystal substrate 20 in accordance with a method the same as that of the first embodiment.

Then, the epitaxial thin film crystal 30 is heated, for example at a temperature of 1000° C. or more and 1500° C. or less for one minute or more and two hours or less, and, more suitably, at a temperature of 1200° C. or more and 1400° C. or less for five minutes or more and 30 minutes or less. The atmosphere during the heating is selected depending on necessity, and is atmospheric air, for example. After the heating, the spontaneous cooling is conducted, for example, in a furnace.

By heating the epitaxial thin film crystal 20, the structure of the crystal regions 30a, 30b separated by the coordination surfaces and alternatively arranged is formed, as shown in FIG. 11b. When, for example, the crystal structure of the epitaxial thin film crystal 30 is tetragonal and a c-axis and an a-axis are present on the surface of this epitaxial thin film crystal 30, such phase separation is likely to take place because of the existence of anisotropy in the surface of the epitaxial thin film crystal 30.

Example 2

Figure 12:
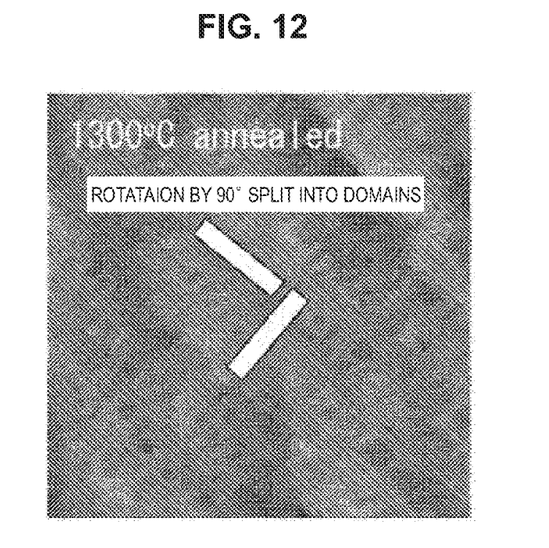
FIG. 12 is a drawing-substituting photograph showing an atomic force microscope photograph of an LLT thin film formed on a (001) $SrTiO_3$ single crystal substrate in Example 2.
Figure 13:
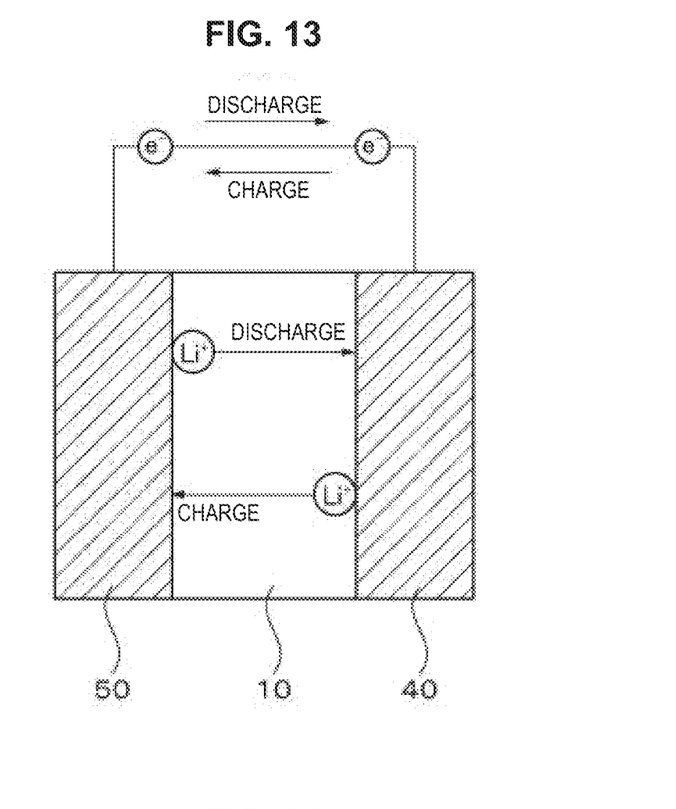
FIG. 13 is a schematic diagram schematically showing an all solid-state lithium ion battery in accordance with a third embodiment.

The LLT epitaxial thin film crystal prepared in Example 1 was heated at 1300° C. for 10 minutes in atmospheric air. An AFM image of the surface of the LLT epitaxial thin film crystal after the heating is shown in FIG. 12. It is found from FIG. 1 12 that the LLT epitaxial thin film crystal was split into domains by the heating. In reality, it is considered that, since the c-axis and the a-axis are present in the surface of the LLT epitaxial thin film crystal and the c-axis of the single crystal regions 30a and the c-axis of the single crystal regions 30b are misaligned by 90° C. from each other, rearrangements take place at these interfaces.

In accordance with this second embodiment, the epitaxial thin film crystal 30 can be obtained in which the single crystal regions 30a, 30b are separated from each other, and are alternatively arranged. In this epitaxial thin film crystal 30, the increase of the movement speed of the Li ion along its thickness direction can be intended because of the domain structure formed by the single crystal regions 30a, 30b.

3. Third Embodiment

"All Solid-State Lithium Ion Battery"

Then, a third embodiment will be described. In this third embodiment, as an electrolyte, the solid electrolyte according to the first embodiment will be used.

Figure 14:
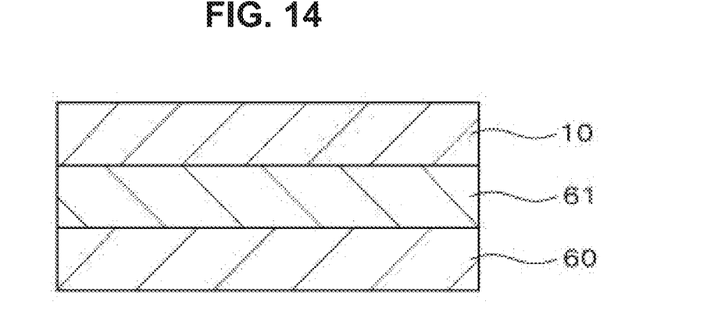
FIG. 14 is a sectional view showing a configuration example of the all solid-state lithium ion battery in accordance with the third embodiment.

FIG. 14 schematically shows the basic configuration of this all solid-state lithium ion battery.

As shown in FIG. 14, this all solid-state lithium ion battery includes a structure in which a positive pole 40 and a negative pole 50 oppose to each other via the epitaxial thin film crystal 10 constituting the solid electrolyte. For example, the positive pole 40 made of $LiCoO_2$ is used, but is not restricted thereto. For example, the negative pole 50 made of graphite is used, but is not restricted thereto.

In this all solid-state lithium ion battery, by using a conductive single crystal substrate 20 as the epitaxial thin film crystal 10, this conductive single crystal substrate 20 can be used as the negative pole or a negative pole current collector. A conductive single crystal layer is mounted on the conductive single crystal substrate 20, and the epitaxial thin film crystal 10 may be mounted thereon. For example, as shown in FIG. 14, a conductive single crystal $Li_4Ti_5O_{12}$ layer 61 is grown on a conductive $SrTiO_3$ single crystal substrate 60, and the epitaxial thin film crystal 10 is grown thereon. In this case, the conductive single crystal $Li_4Ti_5O_{12}$ layer 61 constitutes a negative pole, and the conductive $SrTiO_3$ single crystal substrate 60 constitutes a positive pole. The conductive $SrTiO_3$ single crystal substrate 60 can be obtained by, for example, doping niobium (Nb) on the $SrTiO_3$ single crystal substrate. A conductive oxide layer is used as the positive pole 40, and this conductive oxide layer may be grown on the epitaxial thin film crystal.

"Performance of All Solid-State Lithium Ion Battery"

In this all solid-state lithium ion battery, during the charge, electric energy is converted into chemical energy which is then stored by moving the lithium ion ($Li^+$) from the positive pole 40 to the negative pole 50 through the epitaxial thin film crystal 10 constituting the solid electrolyte. During the discharge, the electric energy is generated by returning the lithium ion from the negative pole 50 to the positive pole 40 through the epitaxial thin film crystal 10.

In accordance with this third embodiment, a novel all solid-state lithium ion battery using the solid electrolyte made of the epitaxial thin film crystal 10 as an electrolyte layer can be realized. This all solid-state lithium ion battery exhibits charge-discharge characteristics comparable to an existing lithium ion battery and can provide the significantly higher safety because no crystal grain boundary exists in the epitaxial thin film crystal 10 constituting the solid electrolyte.

This all solid-state lithium ion battery can be used as a drive power source or an auxiliary power source for such as notebook personal computers, PDA (personal digital assistant), mobile phones, codeless handsets, video movies, digital still cameras, digital books, electronic dictionaries, portable music players, radios, headphones, gaming hardware, navigation systems, memory cards, cardiac pacemakers, acoustic aids, electric tools, electric shavers, refrigerators, air conditioners, televisions, stereos, water heaters, kitchen microwaves, dishwashers, washing machines, drying machines, lighting equipment, toys, clinical instruments, robots, road conditioners, traffic signals, railroad vehicles, golf carts, electric cart and electric cars (including hybrid cars), mounted on a power source of storing power for artificial structures such as houses, and power-generating facilities, or can be used for supplying power thereto. In the electric cars, a conversion apparatus for converting power to driving force by supplying the power is generally a motor. A control apparatus for conducting information processing with regard to vehicle control includes a control apparatus for displaying remaining battery power based on the information regarding the remaining battery power. This lithium sulfur battery can be also used as an electric storage apparatus in a so-called smart grid. Such the electric storage apparatuses can store the power after receiving the power from other power sources in addition to supplying the power. As the other power sources, for example, thermal power generation, atomic power generation, hydraulic power generation, solar cells, wind power generation, geothermal power generation and fuel cells (including biofuel cells) can be used.

Although the embodiments and the Examples of the present disclosure have been specifically described, the present disclosure is not restricted to the above embodiments and Examples, and various modifications are possible.

For example, the numerals, the structures, the configurations, the shapes and the materials are only examples, and numerals, structures, configurations, shapes and materials other than the above may be used depending on necessity.

Additionally, the present technology may also be configured as below.

(1)

A solid electrolyte including:

an epitaxial thin film crystal made of an electrolyte containing at least lithium.

(2)

The solid electrolyte according to (1), wherein the electrolyte is at least one electrolyte selected from the group consisting of an oxide, a phosphoric acid-based compound, a germanic acid-based compound, a sulfide and a nitride.

(3)

The solid electrolyte according to (1) or (2), wherein the electrolyte is at least one electrolyte selected from the group consisting of $La_{2/3-x}Li_{3x}TiO_3$ ($0<x<2/3$), $La_{0.5}Li_{0.5}TiO_3$, $Li_{4+x}M_xSi_{1-x}O_4$ (M=B, Al), $Li_7La_3Zr_2O_{12}$, $Li_9SiAlO_3$, $Li_5La_3Ta_2O_{12}$, $Li_5La_3Nb_2O_{12}$, $Li_6BaLa_2Ta_2O_{12}$, $Li_{3.6}Si_{0.6}P_{0.4}O_4$, $LiZr_2(PO_4)_3$, $Li_{1+x}Al_xTi_{2-x}(PO_4)_3$, $Li_{14}Zn(GeO_4)_4$, $Li_{3.25}Ge_{0.25}P_{0.75}S_4$, $Li_{10}GeP_2S_{12}$ and $Li_3N$.

(4)

The solid electrolyte according to any of (1) to (3), wherein the epitaxial thin film crystal is configured by a terrace which is flat in an atomic level and a steps, and includes a flat surface of which a mean-square surface roughness measured on a region of 2 μm square is 1 nm or less.

(5)

The solid electrolyte according to any of (1) to (4), wherein the epitaxial thin film crystal is epitaxially grown on a single crystal substrate.

(6)

The solid electrolyte according to any of (1) to (5), wherein the single crystal substrate is at least one substrate selected from the group consisting of an oxide having a perovskite-type crystal structure represented by a general formula $ABO_3$ (A is at least one element selected from the group consisting of Sr, Ba, La and K, and B is at least one element selected from the group consisting of Ti, Al and Ta), $NdGaO_3$, YSZ, MgO, $Al_2O_3$ and Si.

(7)

The solid electrolyte according to (6), wherein the oxide having the perovskite-type crystal structure represented by the general formula $ABO_3$ is at least one oxide selected from the group consisting of $SrTiO_3$, $LaAlO_3$ and $(LaSr)(AlTa)O_3$.

(8)

The solid electrolyte according to any of (1) to (7), wherein the epitaxial thin film crystal includes a domain structure formed by at least two single crystal regions of which crystal orientations are different from each other.

(9)

The solid electrolyte according to (8), wherein the at least one single crystal region is present along an entire thickness direction of the epitaxial thin film crystal.

(10)

A method of preparing a solid electrolyte, the method including:

a step of forming an epitaxial thin film crystal by epitaxially growing an electrolyte containing at least lithium on a single crystal substrate.

(11)

The method of preparing a solid electrolyte according to (10), wherein the electrolyte is epitaxially grown on the single crystal substrate through a pulsed laser deposition method, a sputtering method, an electron beam deposition method, a metalorganic chemical vapor deposition method, a molecular beam epitaxy method or an atomic layer epitaxial growth method.

(12)

The method of preparing a solid electrolyte according to (10) or (11), wherein the electrolyte is epitaxially grown on the single crystal substrate at a substrate temperature of 200° C. or more and 1200° C. or less.

(13)

The method of preparing a solid electrolyte according to any of (10) to (12), wherein the electrolyte is epitaxially grown on the single crystal substrate under an atmosphere of which an oxygen partial pressure is $1 \times 10^{-5}$ Pa or more and $1 \times 10^3$ Pa or less.

(14)

The method of preparing a solid electrolyte according to any of (10) to (13), wherein, after the epitaxial thin film crystal is formed by epitaxially growing the electrolyte on the single crystal substrate, a domain structure is formed by at least two single crystal regions of which crystal orientations are different from each other by heating the epitaxial thin film crystal.

(15)

The method of preparing a solid electrolyte according to any of (10) to (14), wherein, after the epitaxial thin film crystal is formed by epitaxially growing the electrolyte on the single crystal substrate, the epitaxial thin film crystal is heated at a temperature of 1000° C. or more and 1500° C. or less for a period of one minute or more and two hours or less.

(16)

An electrochemical device including:

a solid electrolyte including an epitaxial thin film crystal made of an electrolyte which is epitaxially grown and contains at least lithium.

(17)

The electrochemical device according to (16), wherein the electrochemical device is a battery, a capacitor, a sensor using lithium or a lithium ion filter.

(18)

The electrochemical device according to (17), wherein the battery is a secondary battery, an air cell or a fuel cell.

(19)

The electrochemical device according to (18), wherein the secondary battery is a lithium ion battery containing the solid electrolyte as an electrolyte layer.

(20)

The electrochemical device according to any of (16) to (19), wherein the solid electrolyte is mounted on a conductive single crystal substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 10 epitaxial thin film crystal
20 single crystal substrate
30 epitaxial thin film crystal
30a single crystal region
30b single crystal region
40 positive pole
50 negative pole
60 conductive $SrTiO_3$ single crystal substrate
61 conductive single crystal $Li_4Ti_5O_{12}$ layer

The invention claimed is:

1. A solid electrolyte comprising:
an epitaxial thin film crystal made of an electrolyte containing at least lithium,
wherein a surface of the epitaxial thin film crystal includes terraces that are arranged in a stepped configuration,
wherein the electrolyte is at least one electrolyte selected from the group consisting of $La_{2/3-x}Li_{3x}TiO_3$ ($0<x<2/3$), $La_{0.5}Li_{0.5}TiO_3$, $Li_7La_3Zr_2O_{12}$, $Li_9SiAlO_3$, $Li_5La_3Ta_2O_{12}$, $Li_5La_3Nb_2O_{12}$, $Li_6BaLa_2Ta_2O_{12}$, $Li_{3.6}Si_{0.6}P_{0.4}O_4$, $LiZr_2(PO_4)_3$, $Li_{14}Zn(GeO_4)_4$, $Li_{3.25}Ge_{0.25}P_{0.75}S_4$, $Li_{10}GeP_2S_{12}$, $Li_{4+x}M_xSi_{1-x}O_4$ (M=B, Al), $Li_{1+x}Al_xTi_{2-x}(PO_4)_3$ and $Li_3N$,
wherein the epitaxial thin film crystal is epitaxially grown on a single crystal substrate that includes terraces that are atomically flat and that are arranged in a stepped configuration, and
wherein the single crystal substrate is at least one substrate selected from the group consisting of an oxide having a perovskite-type crystal structure represented by a general formula $ABO_3$ (A is at least one element selected from the group consisting of Sr, Ba, La and K, and B is at least one element selected from the group consisting of Ti, Al and Ta), $NdGaO_3$, YSZ, MgO, $Al_2O_3$ and Si.

2. The solid electrolyte according to claim 1,
wherein the epitaxial thin film crystal has a mean-square surface roughness measured on a region of 2 μm square of 1 nm or less.

3. The solid electrolyte according to claim 1,
wherein the oxide having the perovskite-type crystal structure represented by the general formula $ABO_3$ is at least one oxide selected from the group consisting of $SrTiO_3$, $LaAlO_3$ and $(LaSr)(AlTa)O_3$.

4. The solid electrolyte according to claim 1,
wherein the epitaxial thin film crystal includes a domain structure formed by at least two single crystal regions of which crystal orientations are different from each other.

5. The solid electrolyte according to claim 4,
wherein the at least one single crystal region is present along an entire thickness direction of the epitaxial thin film crystal.

* * * * *